United States Patent
Iwaki

(10) Patent No.: US 7,642,155 B2
(45) Date of Patent: Jan. 5, 2010

(54) SEMICONDUCTOR DEVICE WITH METAL NITRIDE BARRIER LAYER BETWEEN GATE DIELECTRIC AND SILICIDED, METALLIC GATE ELECTRODES

(75) Inventor: Takayuki Iwaki, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 37 days.

(21) Appl. No.: 11/606,034

(22) Filed: Nov. 30, 2006

(65) Prior Publication Data

US 2007/0128791 A1 Jun. 7, 2007

(30) Foreign Application Priority Data

Dec. 6, 2005 (JP) ............... 2005-351830

(51) Int. Cl.
*H01L 21/8244* (2006.01)
*H01L 29/94* (2006.01)
(52) U.S. Cl. ............... 438/238; 257/296; 257/E21.021
(58) Field of Classification Search ........... 438/238; 257/296
See application file for complete search history.

(56) References Cited

U.S. PATENT DOCUMENTS 6,208,004 B1 * 3/2001 Cunningham ............... 257/413
6,879,009 B2 * 4/2005 Zheng et al. ............... 257/407
2005/0145943 A1 * 7/2005 Schram et al. ............. 257/350
2005/0269635 A1 * 12/2005 Bojarczuk et al. .......... 257/338
2006/0084247 A1 * 4/2006 Liu ........................... 438/510
2006/0094180 A1 * 5/2006 Doczy et al. ............... 438/199

FOREIGN PATENT DOCUMENTS

JP 2003-77911 * 3/2003
JP 2005-123625 5/2005

OTHER PUBLICATIONS

T. Nabatame et al., "Partial Silicides Technology for Tunable Work Function Electrodes on High-k Gate Dielectrics", IEDM Tech. Dig., pp. 83 (2004).

* cited by examiner

*Primary Examiner*—Matthew Smith
*Assistant Examiner*—Walter H Swanson
(74) *Attorney, Agent, or Firm*—Young & Thompson

(57) ABSTRACT

A method for manufacturing a semiconductor device includes: sequentially depositing a gate insulating film 104 composed of a high dielectric constant film containing one or more metallic element(s) selected from a group consisting of Hf, Zr, Al, La and Ta, a barrier film 106 composed of one or more metal nitride selected from a group consisting of TiN, TaN and WN, a metallic film 108 and a polycrystalline silicon film 110 on the semiconductor substrate (p-type semiconductor substrate 102*a*) to form a multiple-layered film; and silicidizing a lower portion of the polycrystalline silicon film 110 to form a lower layer (forming a first silicide layer 110*a*) by conducting a heat treatment of the multiple-layered film to diffuse the metal of the metallic film 108 into the polycrystalline silicon film 110.

7 Claims, 6 Drawing Sheets

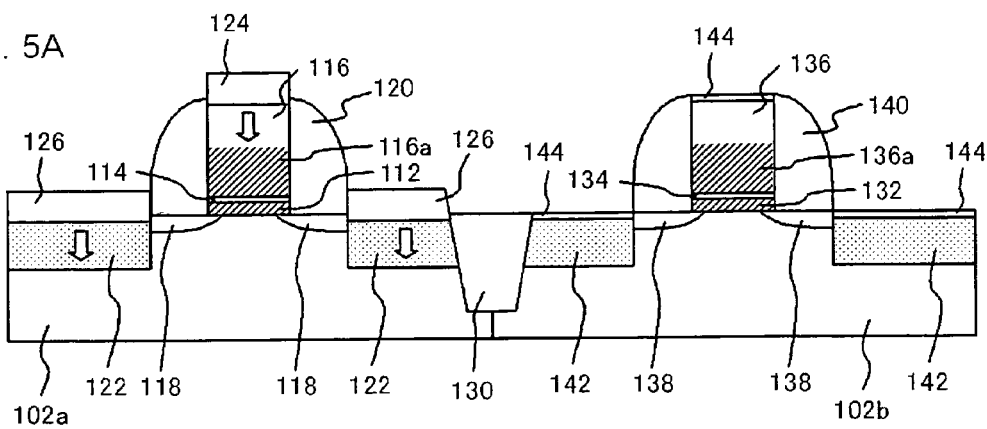
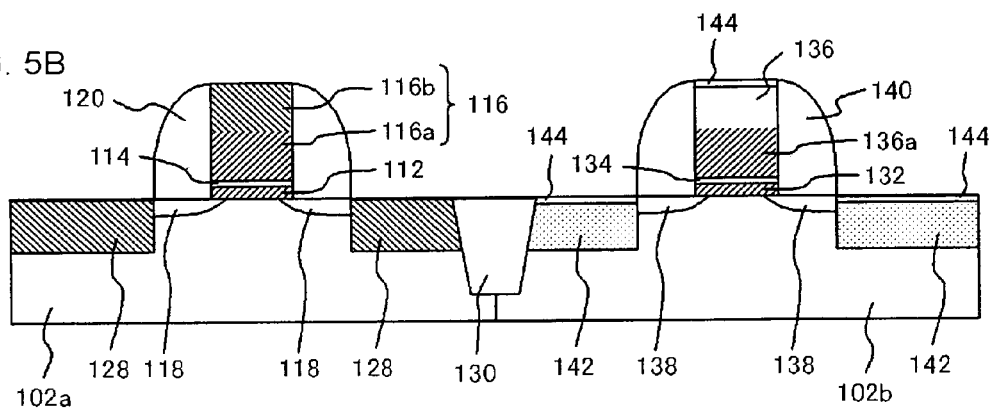
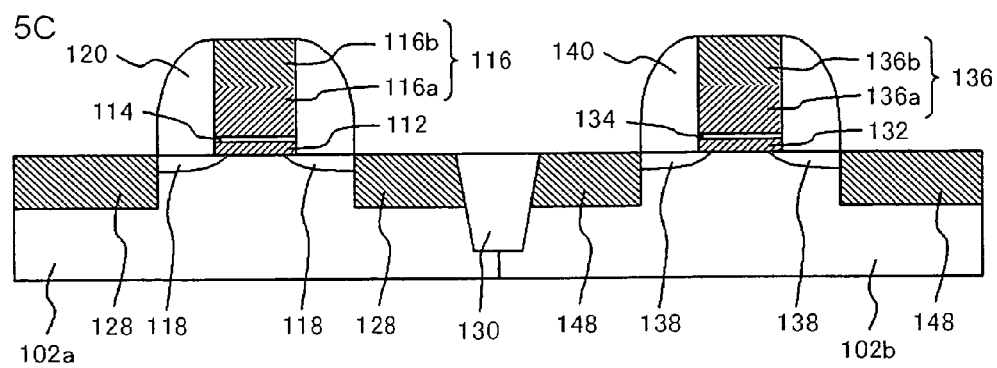

SEMICONDUCTOR DEVICE WITH METAL NITRIDE BARRIER LAYER BETWEEN GATE DIELECTRIC AND SILICIDED, METALLIC GATE ELECTRODES

This application is based on Japanese patent application No. 2005-351,830, the content of which is incorporated hereinto by reference.

BACKGROUND

1. Technical Field

The present invention relates to a method for manufacturing a semiconductor device by silicidizing a lower portion of a polycrystalline silicon film that composes a gate electrode, and to a semiconductor device.

2. Related Art

A semiconductor device having a metallic gate electrode, all of which are silicidized, is developed. A typical process for manufacturing such type of semiconductor device is disclosed by, for example, T. Nabatame et al., IEDM Tech. Dig., pp. 83 (2004).

The manufacturing process of T. Nabatame et al. involves, as shown in FIG. 6, growing a gate insulating film 14 composed of a high dielectric constant film (hereinafter referred to as high-k film) composed of hafnium oxide ($HfO_2$) or the like on a semiconductor substrate 12 via an atomic layer deposition (ALD) process, and further growing a polycrystalline silicon film 16 thereon. Then, a metallic film 18 composed of a nickel (Ni) film or the like having a thickness of about 70 nm is deposited on the entire surface of the polycrystalline silicon film 16 via a sputter process. Then, an annealing process is conducted at a temperature of 400 degree C. to silicidize the whole polycrystalline silicon film 16 (hereinafter referred to as a full silicidation process). After a full silicidation process, an ordinary lithographic process is conducted to pattern a photo resist film formed on the polycrystalline silicon film 16, and further, an etch process is conducted to form a gate electrode pattern.

Japanese Patent Laid-Open No. 2005-123,625 discloses a semiconductor device shown in FIG. 7. As shown in FIG. 7, the semiconductor device includes an extension region 38 and a silicide layer 42 having a silicidized source/drain region (not shown) on a surface region of a semiconductor substrate 22. A gate insulating film 32 composed of a high dielectric constant film and a polycrystalline silicon film 36 are deposited on the surface of semiconductor substrate 22 to form a gate electrode. The polycrystalline silicon film 36 includes a first silicide layer 36a as a lower layer and a second silicide layer 36b as an upper layer. A side wall 40 is formed on the side surfaces of the gate insulating film 32 and the polycrystalline silicon film

SUMMARY OF THE INVENTION

However, there is a room for improvement in view of the following points in the technology described in the above-described conventional technologies. In the process for manufacturing the semiconductor device disclosed by T. Nabatame et al., a polycrystalline silicon film is silicidized from (side of contact) an upper portion of gate electrode via a metallic diffusion process. In this case, an insufficient diffusion of a metal around the gate insulating film may cause a silicon (Si)-rich condition in the gate insulating film side of the gate electrode, causing a generation of Fermi level pinning, so that a threshold electrical voltage would be varied.

On the contrary, in the semiconductor device described in Japanese Patent Laid-Open No. 2005-123,625, the upper layer and the lower layer of the gate electrode are silicidized. However, a leakage current is often generated in such a semiconductor device, causing a deterioration in a long-term reliability of a product.

As described above, a method for manufacturing a semiconductor device, which is capable of providing a reduced variation in threshold electrical voltage by inhibiting a generation of Fermi level pinning, while achieving a stable long-term reliability of a product by inhibiting a generation of leakage current, and such semiconductor device, are required.

According to one aspect of the present invention, there is provided a method for manufacturing a semiconductor device, comprising: forming a gate electrode on a semiconductor substrate, the gate electrode being composed of a gate insulating film, a barrier film and a polycrystalline silicon film, which are sequentially deposited, the gate insulating film being composed of a high dielectric constant film containing one or more metallic element(s) selected from a group consisting of hafnium (Hf), zirconium (Zr), aluminum (Al), lanthanum (La) and tantalum (Ta), the barrier film being composed of one or more metal nitride selected from a group consisting of titanium nitride (TiN), tantalum nitride (TaN) and tungsten nitride (WN), and the polycrystalline silicon film having a silicidized lower layer, wherein the forming the gate electrode includes: forming a multiple-layered film by sequentially depositing a gate insulating film, a barrier film, a metallic film and a polycrystalline silicon film on the semiconductor substrate; and silicidizing a lower portion of the polycrystalline silicon film to form the silicidized lower layer by heating the multiple-layered film to diffuse the metal of the metallic film into the polycrystalline silicon film.

According to the above-described aspect of the present invention, a variation in threshold electrical voltage can be inhibited by inhibiting a generation of Fermi level pinning, while long-term reliability of the product can be stabilized by inhibiting a generation of a leakage current.

More specifically, since the method for manufacturing the semiconductor device of the present invention includes silicidizing the lower portion of the polycrystalline silicon film to form the silicidized lower layer, a diffusion of a metal that composes the gate insulating film (high dielectric constant film) into the polycrystalline silicon film can be inhibited. Therefore, a variation in threshold electrical voltage can be inhibited by inhibiting a generation of Fermi level pinning.

Further, the barrier film composed of a metal nitride is formed on the gate insulating film that is composed of a high dielectric constant film, and the lower portion of the polycrystalline silicon film is silicidized to form the silicidized lower layer on such barrier film. This configuration provides an inhibition to a diffusion of a metal into the gate insulating film when the polycrystalline silicon film is silicidized. Therefore, a generation of a leakage current can be inhibited, so that long-term reliability of the product would be stabilized.

According to one aspect of the present invention, there is provided a semiconductor device, comprising: a semiconductor substrate; and a gate electrode formed on the semiconductor substrate, wherein the gate electrode includes a multiple-layered structure composed of: a gate insulating film composed of a high dielectric constant film containing one or more metallic element selected from a group consisting of hafnium (Hf), zirconium (Zr), aluminum (Al), lanthanum (La) and tantalum (Ta); a barrier film composed of one or more metal nitride selected from a group consisting of titanium nitride (TiN), tantalum nitride (TaN) and tungsten nitride (WN); and a polycrystalline silicon film having a silicidized lower layer.

Since such semiconductor device includes the barrier film on the gate insulating film, a diffusion of a metal into the gate insulating film can be prevented when the polycrystalline silicon film is silicidized, thereby providing an improved manufacturing stability. Further, since the device includes the barrier film on the gate insulating film, a variation in threshold electrical voltage can be inhibited.

According to the present invention, a method for manufacturing a semiconductor device, which is capable of providing a reduced variation in threshold electrical voltage by inhibiting a generation of Fermi level pinning, while achieving a stable long-term reliability of a product by inhibiting a generation of leakage current or the like, and such semiconductor device, are provided.

BRIEF DESCRIPTION OF THE DRAWINGS

The above and other objects, advantages and features of the present invention will be more apparent from the following description taken in conjunction with the accompanying drawings, in which:

FIGS. 5A, 5B and 5C are cross-sectional views of the semiconductor device, schematically illustrating the method for manufacturing the semiconductor device according to second embodiment;

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Preferable embodiments according to the present invention will be described as follows in further detail, in reference to the annexed figures. In all figures, identical numeral is assigned to an element commonly appeared in the figures, and redundant descriptions thereof will not be repeated.

Figure 3:
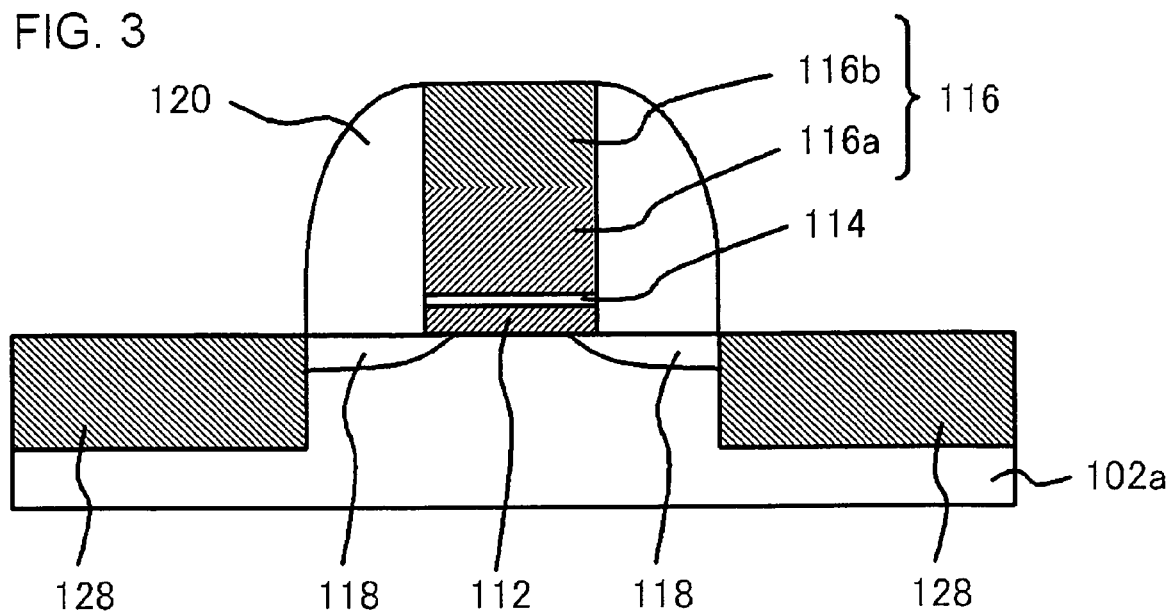
FIG. 3 is a cross-sectional view of the semiconductor device, schematically illustrating the method for manufacturing a semiconductor device according to first embodiment.

A semiconductor device according to the present embodiment includes, as shown in FIG. 3, a gate electrode, which includes a gate insulating film 112 composed of a high dielectric constant film containing one or more metallic element selected from a group consisting of hafnium (Hf), zirconium (Zr), aluminum (Al), lanthanum (La) and tantalum (Ta), a barrier film 114 composed of one or more metal nitride selected from a group consisting of titanium nitride (TiN), tantalum nitride (TaN) and tungsten nitride (WN), and a polycrystalline silicon film 116 having a silicidized lower layer, all of which are sequentially deposited on a semiconductor substrate 102a.

Figure 1A:
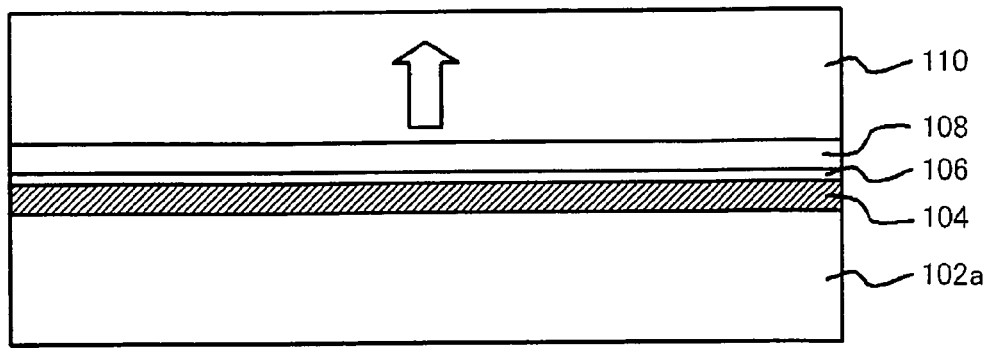
FIGS. 1A and 1B are cross-sectional views of a semiconductor device, schematically illustrating a method for manufacturing a semiconductor device according to first embodiment.
Figure 1B:
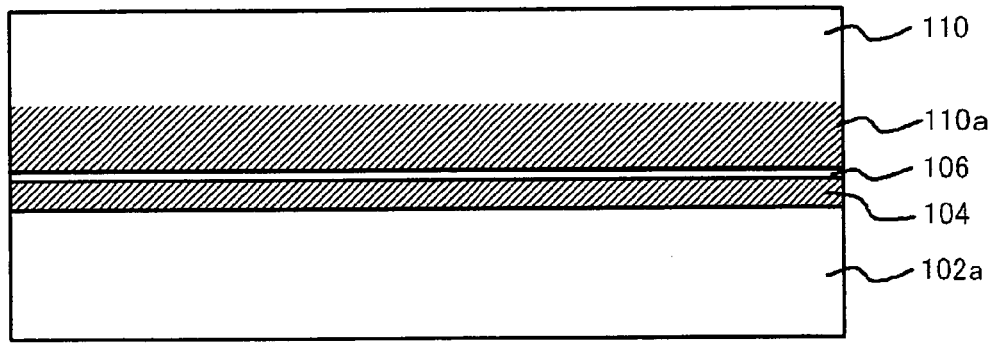

In a process for manufacturing such semiconductor device, an operation for forming the gate electrode includes the following process operations for:

(i) sequentially depositing a gate insulating film 104, a barrier film 106, a metallic film (first metallic film 108) and a polycrystalline silicon film 110 on the semiconductor substrate 102a to form a multiple-layered film (FIG. 1A); and (ii) silicidizing a lower portion of the polycrystalline silicon film 110 to form a lower layer (forming a first silicide layer 110a) by conducting a heat treatment of the multiple-layered film to diffuse the metal of the first metallic film 108 into the polycrystalline silicon film 110 (FIG. 1B).

Processes for manufacturing semiconductor devices will be described as follows by illustrating exemplary implementations in first and second embodiments.

FIRST EMBODIMENT

In first embodiment, a case of forming an n-type metal oxide semiconductor field effect transistor (MOSFET) will be described.

First of all, as shown in FIG. 1A, a gate insulating film 104, a barrier film 106, a first metallic film 108 and a polycrystalline silicon film 110 are sequentially deposited on a p-type semiconductor substrate 102a.

The gate insulating film 104 may be composed of a high dielectric constant film containing one or more metallic element(s) selected from a group consisting of Hf, Zr, Al, La and Ta. More specifically, typical high dielectric constant films may include hafnium oxide ($HfO_2$) film, zirconium oxide ($ZrO_2$) film, aluminum oxide ($Al_2O_3$) film, lanthanum oxide ($LaO_2$) film, tantalum oxide ($Ta_2O_5$) films or the like. The gate insulating film 104 may be formed by conducting about 20 cycles of a deposition process via, for example, an atomic layer deposition (ALD) process. The thickness of the gate insulating film 104 may be about 3 nm to 4 nm.

The barrier film 106 may be composed of one or more metal nitride selected from a group consisting of TiN, TaN and WN, in view of providing an improved electrical conductivity. The barrier film 106 may be formed by conducting about 5 cycles of a deposition process via, for example, an ALD process. The thickness of the barrier film 106 may be about 0.5 nm to 1 nm.

The first metallic film 108 may be formed via, for example, a sputter process. The first metallic film 108 may be composed of a film of a metal such as nickel (Ni), cobalt (Co), tungsten (W), titanium (Ti) and the like, and such film may be employed alone or a combination of such films may be employed. Suitable metal that is capable of exhibiting advantageous effects such as providing a reduced electrical resistance, an inhibition of Fermi level pinning and the like in a first silicide layer 116a as discussed later may be selected for the first metallic film 108.

The polycrystalline silicon film 110 may be formed via, for example, a chemical vapor deposition (CVD) process or the like.

Subsequently, an annealing process may be conducted at a temperature around 500 degree C. for about several minutes, so that a counter diffusion of the metal of the first metallic film 108 and silicon (Si) of the polycrystalline silicon film 110 is created, thereby forming a first silicide layer 110a in the lower portion of the polycrystalline silicon film 110 (FIG. 1B). The component of such first silicide layer 110a may be represented as $M_xSi$ (where M is a metallic element selected from Ni, Co, W and Ti, and x is a number of not less than 1). Having such component, a generation of Fermi level pinning can be further inhibited, so that a variation in threshold voltage can be effectively inhibited.

Figure 2A:
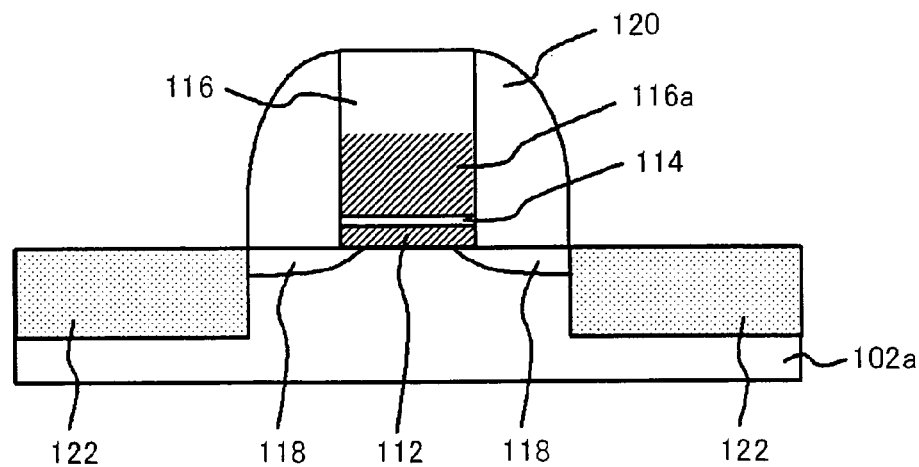
FIGS. 2A and 2B are cross-sectional views of the semiconductor device, schematically illustrating the method for manufacturing the semiconductor device according to first embodiment.

Then, a lithographic process and a reactive ion etching (RIE) process are conducted to form a gate electrode, and further an extension region 118, a side wall 120 and a source/drain region 122 are formed according to an ordinary process (FIG. 2A).

Figure 2B:
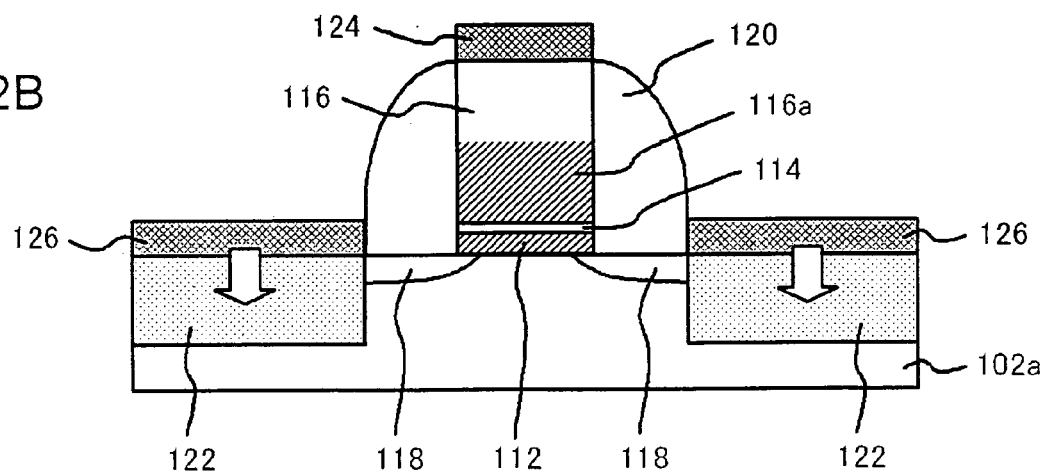

Subsequently, a second metallic film is formed on the entire wafer surface via a sputter process or the like. Then, the polycrystalline silicon film 116 and the source/drain region 122 are silicidized by the presence of the second metallic film 124 and 126, which have been deposited on the surfaces thereof (FIG. 2B). An annealing process, for example, is conducted at a temperature around 650 degree C. for about several minutes. The second metallic film 124 and 126 may be composed of a metal such as Ni, Co, W, Ti and the like, and such metal may be employed alone or a combination of such films may be employed. Suitable metal that is capable of exhibiting advantageous effects such as providing a reduced electrical resistance, an improved ohmic property, an affinity with the contact plug or the like in a second silicide layer 116b and a silicide layer 128 as discussed later may be selected for the second metallic film 124 and 126.

The silicidation provides the second silicide layer 116b and the silicide layer 128 formed on the upper layer of the gate electrode and the source/drain region 122, respectively (FIG. 3). This results in providing a full silicide metallic gate structure for the polycrystalline silicon film 116, which includes the first silicide layer 116a serving as the lower layer and the second silicide layer 116b serving as the upper layer. Thereafter, predetermined operations are conducted to manufacture a semiconductor device comprising an n-type MOSFET.

Advantageous effects obtainable by employing the configuration of first embodiment will be described as follows.

According to the method for manufacturing the semiconductor device of the present embodiment, a semiconductor device can be provided, which is capable of providing a reduced variation in threshold electrical voltage by inhibiting a generation of Fermi level pinning, while achieving a stable long-term reliability of a product by inhibiting a generation of leakage current or the like.

On the contrary, in the process for manufacturing the semiconductor device described in the aforementioned Japanese Patent Laid-Open No. 2005-123,625, a film of a metal such as Ni or Co and a polycrystalline silicon film are deposited on the surface of the gate insulating film composed of a high dielectric constant film. Subsequently, a heat treatment process is conducted to diffuse the metal of the metallic film into the polycrystalline silicon film to provide a silicidation of the lower portion thereof.

However, in the semiconductor devices obtained by such manufacturing process, a reliability of a product, particularly a long-term reliability may be deteriorated due to a generation of a leakage current. In conventional semiconductor devices, a generation of such leakage current has not been found, and a silicidation of a polycrystalline silicon film is ordinarily conducted in the surface of the gate insulating film composed of a high dielectric constant film, as described in Japanese Patent Laid-Open No. 2005-123,625. Under such circumstances, the present inventors have eagerly investigated, and found that the metal of the metallic film may be diffused into the gate insulating film in the process for silicidizing the lower portion of the polycrystalline silicon film, and this leads to a generation of a leakage current in the semiconductor device.

More specifically, in the process for manufacturing the semiconductor device of the present embodiment, the gate insulating film, the barrier film, the metallic film and the polycrystalline silicon film are sequentially deposited on the semiconductor substrate to form the multiple-layered film, and then the heat-treating process is conducted over the multiple-layered film to diffuse the metal of the metallic film into the polycrystalline silicon film, thereby silicidizing the lower part of the polycrystalline silicon film. As described above, since the barrier film is presented between the gate insulating film and the metallic film, a diffusion the metal composing the metallic film into the gate insulating film can be inhibited. Therefore, a generation of a leakage current can be inhibited, so that the long-term reliability of the product be stable. Further, a variation in threshold electrical voltage can be inhibited by inhibiting a generation of Fermi level pinning.

Further, since the barrier film is provided on the gate insulating film composed of a high dielectric constant film according to the semiconductor device of the present embodiment, a diffusion of a metal into the gate insulating film can be prevented when the polycrystalline silicon film is silicidized, thereby providing an improved manufacturing stability. Further, since the device includes the barrier film on the gate insulating film, a transfer of moisture into the gate insulating film can be inhibited, so that a variation in threshold electrical voltage can be inhibited.

SECOND EMBODIMENT

In the second embodiment, a formation of an n-type MOSFET and a p-type MOSFET, which are arranged to be adjacent, will be illustrated. In the following discussions, an n-type MOSFET forming region includes both a region where an n-type MOSFET is to be formed and a region where an n-type MOSFET has been formed. Further, a p-type MOSFET forming region includes both a region where a p-type MOSFET is to be formed and a region where a p-type MOSFET has been formed.

First of all, a semiconductor substrate 102 is prepared, in which a p-type semiconductor substrate 102a is isolated from an n-type semiconductor substrate 102b by an element isolation film 130.

Figure 4A:
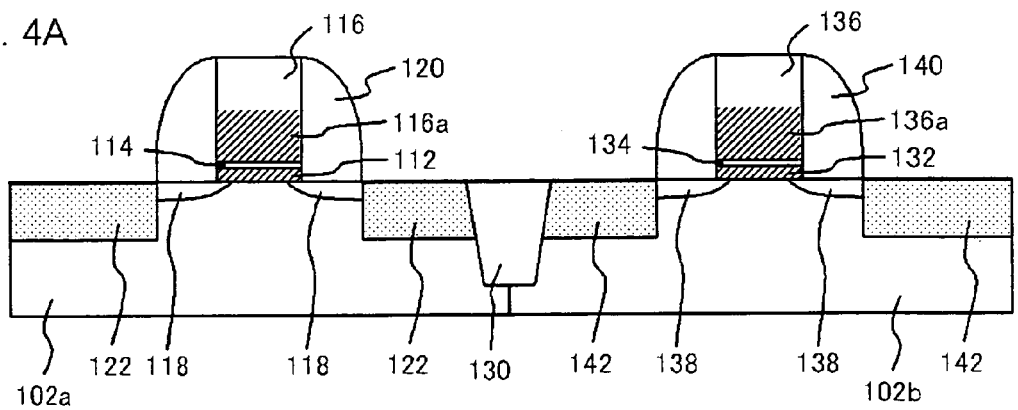
FIGS. 4A, 4B and 4C are cross-sectional views of a semiconductor device, schematically illustrating a method for manufacturing the semiconductor device according to second embodiment.

In an n-type MOSFET forming region, a gate electrode having a gate insulating film 112, a barrier film 114 and a polycrystalline silicon film 116 having a first silicide layer 116a in the lower portion are deposited on the p-type semiconductor substrate 102a, is formed via a process similar as the process employed in first embodiment. Further, an extension region 118 and a source/drain region 122 are formed on the surface of the p-type semiconductor substrate 102a, and a side wall 120 is formed on the side surfaces of the gate insulating film 112, the barrier film 114 and the polycrystalline silicon film 116 (FIG. 4A).

On the contrary, in a p-type MOSFET forming region, a gate electrode having a gate insulating film 132, a barrier film 134 and a polycrystalline silicon film 136 having a first silicide layer 136a in the lower portion are deposited on the n-type semiconductor substrate 102b, is formed via a process similar as the process employed in first embodiment. Further, an extension region 138 and a source/drain region 142 are formed on the surface of the n-type semiconductor substrate 102b, and a side wall 140 is formed on the side surfaces of the gate insulating film 132, the barrier film 134 and the polycrystalline silicon film 136 (FIG. 4A).

The gate insulating film 112 may contain the same metallic element as, or may contain different metallic element from, the gate insulating film 132. Further, the barrier film 114 may contain the same metal nitride film as, or may contain different metal nitride film from, the barrier film 134. Furthermore, the first silicide layer 116a may be may be silicidized with the same metal as, or may be silicidized with the different metal from, the metal utilized for silicidizing the first silicide layer 136a.

Figure 4B:
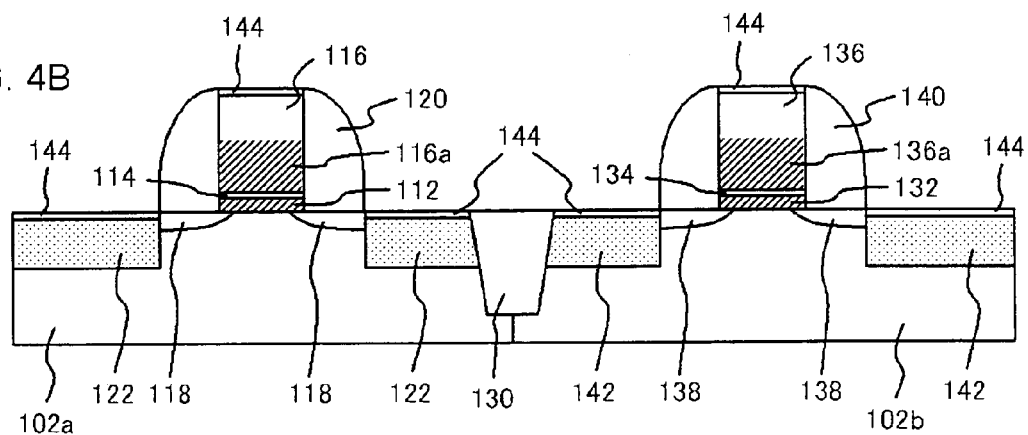

Subsequently, an oxide film 144 is formed on the surfaces of the polycrystalline silicon films 116 and 136 and the surfaces of the source/drain regions 122 and 142 (FIG. 4B). The oxide film 144 may be formed via a thermal oxidation process.

Figure 4C:
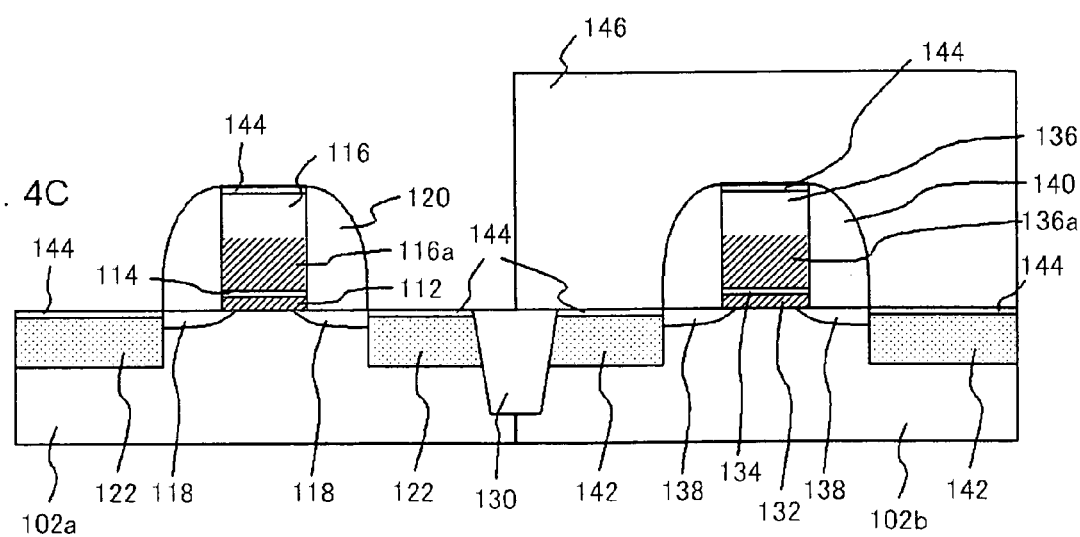
Figure 6:
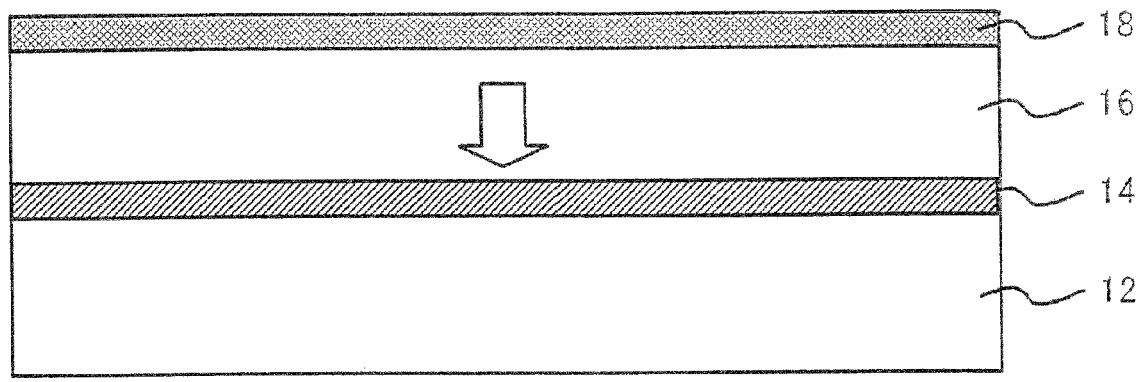
FIG. 6 is a cross-sectional view of a semiconductor device, schematically illustrating a conventional method for manufacturing a semiconductor device.
Figure 7:
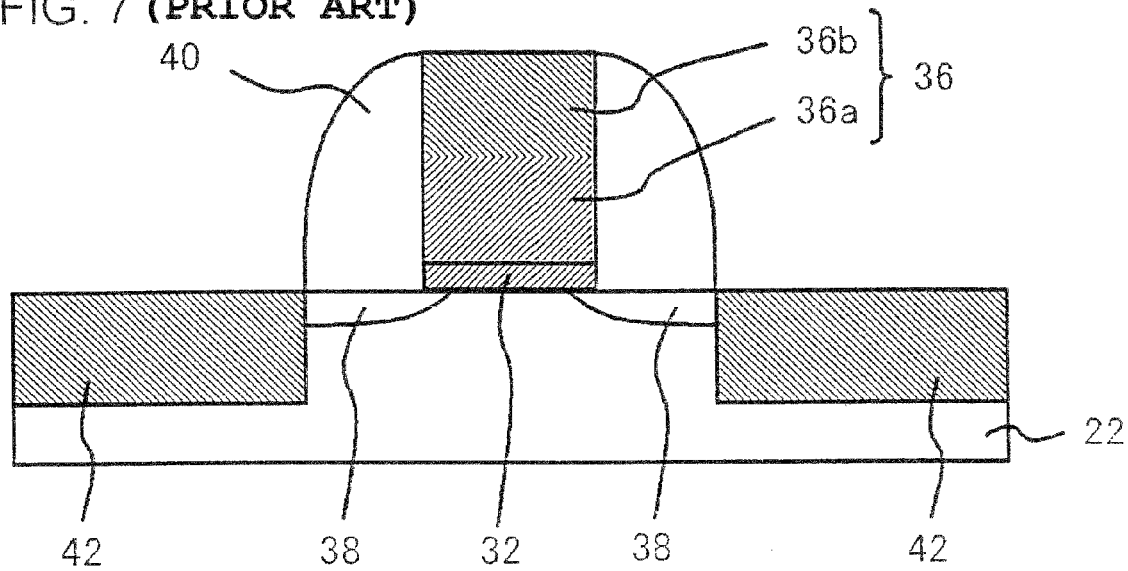
FIG. 7 is a cross-sectional view of the semiconductor device, schematically illustrating the conventional method for manufacturing a semiconductor device.

Then a photo resist film is formed to cover the n-type MOSFET forming region and the p-type MOSFET forming region, and then, an ordinary lithographic process is conducted to partially leave the photo resist film 146 only on the p-type MOSFET forming region (FIG. 4C).

Subsequently, an ordinary dry etch process is conducted to remove the oxide film 144 on the n-type MOSFET forming region. Thereafter, the photo resist 146 is stripped, and then a second metallic film is formed over the entire surface of the wafer via a sputter process. In the n-type MOSFET forming region, the polycrystalline silicon film 116 and the source/drain region 122 are silicidized, similarly as in first embodiment, by the presence of the second metallic film 124 and 126, which have been deposited on the surfaces thereof (FIG. 5A). On the contrary, since an oxide film is formed on the top surface of the polycrystalline silicon film 136 and the source/drain region 142 in the p-type MOSFET forming region, a silicidation is not proceeded.

The silicidation process provides the second silicide layer 116b and the silicide layer 128 (FIG. 5B). This configuration provides the polycrystalline silicon film 116 composing the gate electrode to have a full silicide metallic gate structure, which includes the first silicide layer 116a as the lower layer and the second silicide layer 116b as the upper layer.

Further, concerning the p-type MOSFET forming region, processes similar to the processes for the n-type MOSFET forming region described above may be conducted to provide the polycrystalline silicon film 136 composing the gate electrode to have a full silicide metallic gate structure, which includes the first silicide layer 136a as the lower layer and the second silicide layer 136b as the upper layer. More specifically, a process operation for forming a photo resist film in the n-type MOSFET forming region, a process operation for removing the oxide film 144, a process operation for depositing the second metallic film and a process operation for silicidation are conducted. This procedure provides the polycrystalline silicon film 136 composing the gate electrode to have a full silicide metallic gate structure, which includes the first silicide layer 136a as the lower layer and the second silicide layer 136b as the upper layer.

Thereafter, predetermined operations are conducted to manufacture a semiconductor device comprising an n-type MOSFET and a p-type MOSFET.

Advantageous effects obtainable by employing the configuration of second embodiment will be described as follows.

According to the method for manufacturing the semiconductor device of the present embodiment, an improved flexibility in designing the devices can be presented, including the facts that different types of the second metallic film for silicidizing the polycrystalline silicon film may be employed for the n-type MOSFET and the p-type MOSFET, the upper portion of the polycrystalline silicon film is not silicidized, or the like.

While the preferred embodiments of the present invention have been described above in reference to the annexed figures, it should be understood that the disclosures above are presented for the purpose of illustrating the present invention, and various configurations other than the above described configurations can also be adopted.

For example, while the full silicide gate structure is illustrated in the present embodiment, an additional polycrystalline polysilicon layer may be disposed between the first silicide layer 116a and the second silicide layer 116b.

Further, in the present embodiment, the lower portion and the upper portion of the polycrystalline silicon film 110 may be sequentially or simultaneously silicidized, and then the polycrystalline silicon film 110 may be etched to form a gate electrode.

Furthermore, in the present embodiment, a multiple-layered film composed of the gate insulating film 104, the barrier film 106, the first metallic film 108 and the polycrystalline silicon film 110 may be etched to form a gate electrode geometry, and then, the lower portion and the upper portion of the polycrystalline silicon film 110 may be sequentially or simultaneously silicidized to form a gate electrode.

Further, while the case of forming the n-type MOSFET is illustrated in first embodiment, the procedure may also be applied to the formation of the p-type MOSFET. While a formation of an n-type MOSFET and a p-type MOSFET, which are arranged to be adjacent, has been illustrated in second embodiment, these MOSFETs may alternatively be separated, or a combination of n-type MOSFETs or a combination of p-type MOSFETs may also be applied.

EXAMPLES

Example 1

A semiconductor device was manufactured by a method similar as employed in first embodiment (FIG. 1 to FIG. 3). Manufacture conditions and configuration of a semiconductor device are described below:
gate insulating film 104: $HfO_2$ film, film thickness of 4 nm (deposited by 20 cycle of ALD processes);
barrier film 106: TiN film, film thickness of 1 nm (deposited by 5 cycle of ALD processes);
first metallic film 108: Ni film (deposited by sputter process);
polycrystalline silicon film 110: deposited by CVD process;
second metallic films 124 and 126: W film (deposited by sputter process);
condition for forming the first silicide layer 110a: annealing at around 500 degree C. for 5 minutes; and
condition for forming the second silicide layer 116b: annealing at around 650 degree C. for 5 minutes.

Comparative Example 1

A semiconductor device was manufactured by a method similar as employed in example 1, except that the barrier film 106 is not formed, but the first metallic film 108 was formed on the gate insulating film 104.

As a result, it was confirmed in the semiconductor device of example 1 that a generation of Fermi level pinning is inhibited and thus a variation in threshold voltage was inhibited. Further, it was confirmed that no generation of leakage current was detected and thus sufficient long-term reliability for the product was obtained. On the contrary, it was confirmed in the semiconductor device of comparative example 1 that a generation of leakage current was detected and thus insufficient long-term reliability for the product was obtained.

Further, component ($Ni_xSi$) of the first silicide layer 116a in vicinity of the barrier film 114 was examined in example 1 via an energy dispersive X-ray spectroscopy (EDS) analysis, and it was found that the component was $Ni_2Si$, and it was confirmed that a variation in threshold voltage was particularly inhibited as compared with the case of component of $Ni_{0.5}Si$.

It is apparent that the present invention is not limited to the above embodiment, and may be modified and changed without departing from the scope and spirit of the invention.

What is claimed is:

1. A semiconductor device, comprising:
  a semiconductor substrate; and
  a gate electrode formed on said semiconductor substrate,
  wherein said gate electrode includes a multiple-layered structure composed of:
  a gate insulating film composed of a high dielectric constant film containing one or more metallic elements selected from a group consisting of hafnium (Hf), zirconium (Zr), aluminum (Al), lanthanum (La) and tantalum (Ta);
  a barrier film composed of one or more metal nitrides selected from a group consisting of titanium nitride (TiN), tantalum nitride (TaN) and tungsten nitride (WN); and
  a polycrystalline silicon film having a silicidized lower layer.

2. The semiconductor device according to claim 1, wherein a portion in said polycrystalline silicon film around said metal nitride film include $M_xSi$ (where M is a metallic element selected from Ni, Co, W and Ti, and x is a number of not less than 1).

3. The semiconductor device according to claim 2, wherein an upper layer of said polycrystalline silicon film is a silicide layer.

4. The semiconductor device according to claim 3, wherein different type of metals are used for silicidizing said upper layer and said lower layer of said polycrystalline silicon film, respectively.

5. The semiconductor device according to claim 1, wherein an upper layer of said polycrystalline silicon film is a silicide layer.

6. The semiconductor device according to claim 5, wherein different type of metals are used of silicidizing said upper layer and said lower layer of said polycrystalline silicon film, respectively.

7. The semiconductor device according to claim 1, further comprising:
  a second semiconductor substrate isolated from said semiconductor substrate, in which a polarity of said second semiconductor substrate is opposite to a polarity of said semiconductor substrate; and
  a second gate electrode formed on said second semiconductor substrate,
  wherein said second gate electrode includes a multiple-layered structure composed of:
  a second gate insulating film composed of a high dielectric constant film containing one or more metallic elements selected from a group consisting of hafnium (Hf), zirconium (Zr), aluminum (Al), lanthanum (La) and tantalum (Ta);
  a second barrier film composed of one or more metal nitrides selected from a group consisting of titanium nitride (TiN), tantalum nitride (TaN), and tungsten nitride (WN); and
  a second polycrystalline silicon film having a silicidized lower layer.

* * * * *

UNITED STATES PATENT AND TRADEMARK OFFICE
CERTIFICATE OF CORRECTION

PATENT NO.        : 7,642,155 B2                                            Page 1 of 1
APPLICATION NO. : 11/606034
DATED             : January 5, 2010
INVENTOR(S)       : Takayuki Iwaki It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 73 days.

Signed and Sealed this

Twenty-first Day of December, 2010

David J. Kappos
*Director of the United States Patent and Trademark Office*